US006231725B1

(12) United States Patent
Nulman et al.

(10) Patent No.: US 6,231,725 B1
(45) Date of Patent: May 15, 2001

(54) APPARATUS FOR SPUTTERING MATERIAL ONTO A WORKPIECE WITH THE AID OF A PLASMA

(75) Inventors: Jaim Nulman, Palo Alto; Zheng Xu, Foster City, both of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/129,109

(22) Filed: Aug. 4, 1998

(51) Int. Cl.$^7$ ................................................... C23C 14/34
(52) U.S. Cl. ............................. 204/192.12; 204/192.17; 204/298.06; 204/298.17; 204/298.18; 204/298.19; 204/298.2
(58) Field of Search .................. 204/192.12, 192.15, 204/192.17, 298.06, 298.17, 298.18, 298.19, 298.2, 298.22, 298.08

(56) References Cited

U.S. PATENT DOCUMENTS

| 3,594,301 | 7/1971 | Bruch | 204/298.26 |
| 4,336,118 | 6/1982 | Patten et al. | 204/192.12 |
| 4,416,760 | 11/1983 | Turner | 204/298.11 |
| 4,600,492 | * 7/1986 | Ooshio et al. | 204/298.2 |
| 4,622,121 | * 11/1986 | Wegmann et al. | 204/298.18 |

(List continued on next page.)

FOREIGN PATENT DOCUMENTS

| 59-190363 | 10/1984 | (EP) . |
| 0520519 | 12/1992 | (EP) . |
| 0774886 | 5/1997 | (EP) . |
| 0 807 954 | * 11/1997 | (EP) . |
| 2162365 | 1/1986 | (GB) . |
| 2231197 | 11/1990 | (GB) . |
| 61-190070 | 8/1986 | (JP) . |
| 5-263234 | 10/1993 | (JP) . |
| 6-232055 | 8/1994 | (JP) . |
| 6-283470 | 10/1994 | (JP) . |
| 7-176398 | 7/1995 | (JP) . |
| 7-176399 | 7/1995 | (JP) . |
| 8-153712 | 6/1996 | (JP) . |
| 8606923 | 11/1986 | (WO) . |

OTHER PUBLICATIONS

U.S. 09/362,917 filed Jul. 27, 1999 (Atty. Dkt. 2326/7005).
U.S. 09/170,874 filed Oct. 13, 1998 (Atty. Dkt. 1557/5117).
U.S. 08/853,024 filed May 8, 1997 (Atty. Dkt. 1186.P1/5464).
U.S. 08/851,946 filed May 6, 1997 (Atty. Dkt. 1390.C1/5491).
U.S. 09/049,839 filed Mar. 27, 1998 (Atty. Dkt. 938.D1/5702).
U.S. 09/049,276 filed Mar. 27, 1998 (Atty. Dkt. 938.D2/5703).
M. Yamashita, "Sputter Type High Frequency Ion Source for Ion Beam Deposition Apparatus," *Jap. J. Appl. Phys.*, vol. 26, pp. 721–727, 1987.
M. Yamashita, "Fundamental Characteristics of Built–in High Frequency Coil Type Sputtering Apparatus," *J. Vac. Sci. Technol.*, vol A7, pp. 151–158, 1989.

(List continued on next page.)

Primary Examiner—Rodney McDonald
(74) Attorney, Agent, or Firm—Konrad Raynes & Victor LLP

(57) ABSTRACT

An apparatus for sputtering material onto a workpiece, composed of: a chamber; a first target disposed in the chamber for sputtering material onto the workpiece; a holder for holding the workpiece in the chamber; a plasma generation area between the target and the holder; a coil for inductively coupling energy into the plasma generation area for generating and sustaining a plasma in the plasma generation area; and a second target disposed in the chamber below the first target and above the coil for sputtering material onto the workpiece.

40 Claims, 6 Drawing Sheets

U.S. PATENT DOCUMENTS

| | | | |
|---|---|---|---|
| 4,661,228 | 4/1987 | Mintz | 204/192.25 |
| 4,842,703 | 6/1989 | Class et al. | 204/192.12 |
| 4,865,712 | 9/1989 | Mintz | 204/298.16 |
| 4,941,915 | 7/1990 | Matsuoka et al. | 204/298.12 |
| 4,990,229 | 2/1991 | Campbell et al. | 204/298.06 |
| 5,122,251 | 6/1992 | Campbell et al. | 204/298.06 |
| 5,178,739 * | 1/1993 | Barnes et al. | 204/192.12 |
| 5,234,560 | 8/1993 | Kadlec et al. | 204/192.12 |
| 5,241,245 | 8/1993 | Barnes et al. | 315/111.41 |
| 5,280,154 | 1/1994 | Cuomo et al. | 219/121.52 |
| 5,304,279 | 4/1994 | Coutlas et al. | 156/345 |
| 5,366,585 | 11/1994 | Robertson et al. | 216/67 |
| 5,397,962 | 3/1995 | Moslehi | 315/111.51 |
| 5,404,079 | 4/1995 | Ohkuni et al. | 315/111.81 |
| 5,417,834 * | 5/1995 | Latz | 204/298.11 |
| 5,418,431 | 5/1995 | Williamson et al. | 315/111.51 |
| 5,429,070 | 7/1995 | Campbell et al. | 118/723 R |
| 5,429,995 | 7/1995 | Nishiyama et al. | 438/788 |
| 5,430,355 | 7/1995 | Paranjpe | 315/111.21 |
| 5,431,799 | 7/1995 | Mosely et al. | 204/298.06 |
| 5,503,676 | 4/1996 | Shufflebotham et al. | 118/723 MR |
| 5,639,357 | 6/1997 | Xu | 204/192.3 |
| 5,707,498 * | 1/1998 | Ngan | 204/192.12 |
| 5,925,225 * | 7/1999 | Ngan et al. | 204/298.06 |

OTHER PUBLICATIONS

S.M. Rossnagel et al., "Magnetron Sputter Deposition with High Levels of Metal Ionization," *Appl. Phys. Lett.*, vol. 63, pp. 3285–3287, 1993.

J. Hopwood et al., "Mechanisms for Highly Ionized Magnetron Sputtering," *J. Appl. Phys.*, vol. 78, pp. 758–765, 1995.

S. M. Rossnagel, "Directional and Ionized Sputter Deposition for Microelectronics Applications," *Proc. of 3rd ISSP (Tokyo)*, pp. 253–260, 1995.

M. Matsuoka et al., Dense Plasma Production and Film Deposition by New High–Rate Sputtering Using an Electric Mirror, *J. Vac. Sci. Technol.*, A 7 (4), 2652–2657, Jul./Aug. 1989.

N. Jiwari et al., "Helicon wave plasma reactor employing single–loop antenna," *J. of Vac. Sci. Technol.*, A 12(4), pp. 1322–1327, Jul./Aug. 1994.

U.S. patent application Serial No. 08/789,960, filed Jan. 30, 1997, (Atty. Dkt. 1643/MD/PVD/DV).

U.S. patent application Serial No. 08/857,921, filed May 16, 1997, (Atty. Dkt. 1737/MD/PVD/DV).

U.S. patent application Serial No. 08/929,739, filed Sep. 15, 1997, (Atty. Dkt. 2168/MD/PVD/DV).

* cited by examiner

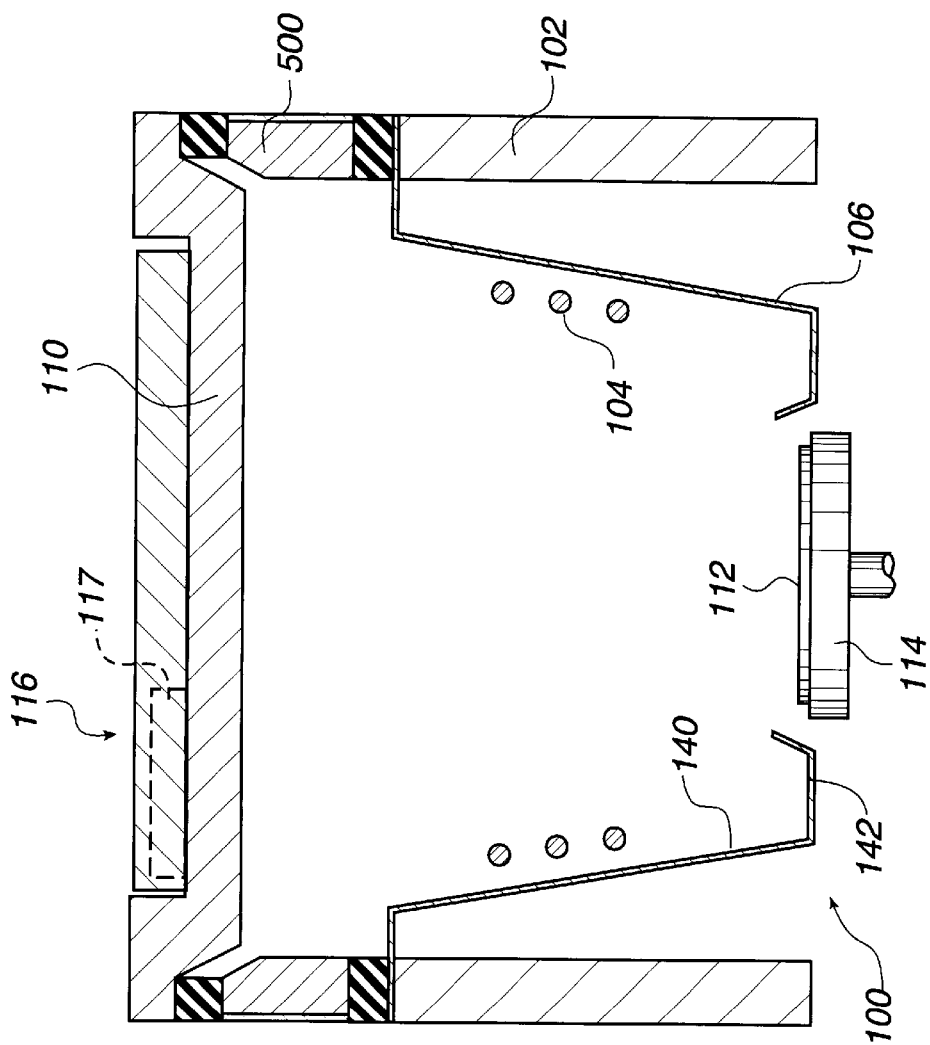

APPARATUS FOR SPUTTERING MATERIAL ONTO A WORKPIECE WITH THE AID OF A PLASMA

FIELD OF THE INVENTION

The present invention relates to plasma generators, and more particularly, to methods and devices for generating a plasma to sputter deposit a layer of material onto a substrate during the fabrication of semiconductor devices.

BACKGROUND OF THE INVENTION

A number of semiconductor device fabrication procedures include processes in which a material is sputtered from a target onto a workpiece such as a semiconductor wafer. Material is sputtered from the target, which is appropriately biased, by the impact of ions created in the vicinity of the target. A certain proportion of the sputtered material may be ionized by a plasma such that the resulting ions can be attracted to the wafer. The wafer is mounted on a support and is usually biased to a potential selected to attract the sputtered, ionized material. Typically, the sputtered material is composed of positive ions and the workpiece is negatively biased.

Sputtered material has a tendency to travel in straight line paths from the target to the substrate at angles which are oblique to the surface of the substrate. As a consequence, high aspect ratio (depth to width) features such as trenches and holes on a substrate surface may not be completely filled during deposition because deposition material may build up near the top edges of the high aspect ratio feature and close off a void or cavity. For example, as illustrated in FIG. 1a, sputtered material 20 may build up near the upper edges of the high aspect ratio trenches 22 located between features 26 on a substrate 28. As the sputtered material 20 accumulates, a void or cavity 24 may become closed off within each trench 22, as illustrated in FIG. 1b. To inhibit the formation of such cavities, the sputtered material can be redirected into substantially vertical paths between the target and the substrate by negatively charging the substrate and positioning appropriate vertically oriented electric fields adjacent the substrate if the sputtered material is sufficiently ionized by the plasma. However, material sputtered by a low density plasma often has an ionization degree of less than 10% which is usually insufficient to avoid the formation of an excessive number of cavities. Accordingly, it is desirable to increase the density of the plasma to increase the ionization rate of the sputtered material in order to decrease the formation of unwanted cavities in the deposition layer. As used herein, the term "dense plasma" is intended to refer to one that has a high electron and ion density.

There are several known techniques for exciting a plasma with RF fields including capacitive coupling, inductive coupling and wave heating. In a standard inductively coupled plasma (ICP) generator, RF current passing through a coil surrounding the plasma induces electromagnetic currents in the plasma. These currents heat the conducting plasma by ohmic heating, so that it is sustained in steady state. As shown in U.S. Pat. No. 4,362,632, for example, current through a coil is supplied by an RF generator coupled to the coil through an impedance matching network, such that the coil acts as the first windings of a transformer. The plasma acts as a single turn second winding of a transformer.

In many high density plasma applications, it is preferable for the chamber to be operated at a relatively high pressure so that the frequency of collisions between the plasma ions and the deposition material atoms is increased to thereby increase the residence time that the sputtered material remains in the high density plasma zone. However, scattering of the deposition atoms is likewise increased. This scattering of the deposition atoms typically causes the thickness of the deposition layer on the substrate to be thicker on that portion of the substrate aligned with the center of the target and thinner in the outlying regions. It has been found that the deposition layer can be made more uniform by reducing the distance between the target and the substrate which reduces the effect of the plasma scattering.

On the other hand, in order to increase the plasma density to increase the ionization of the sputtered atoms, it has been found desirable to increase the distance between the target and the substrate. The coil which is used to couple energy into the plasma typically encircles the space between the target and the substrate. If the target is positioned too closely to the substrate, the ionization of the sputtered material can be adversely affected. Thus, in order to accommodate the coil which is coupling RF energy into the plasma, it has often been found necessary to space the target from the substrate a certain minimum distance even though such a minimum spacing can have an adverse effect on the uniformity of the deposition.

In addition, certain chambers include a coil which is fabricated from a material which can sputtered. In such chambers, the coil acts as an additional target for sputtering. This feature allows the deposition profile to be modified and may help to improve the uniformity of deposition material on the substrate.

It has also been proposed to utilize more than one target. For example, U.S. Pat. No. 5,178,739 describes a chamber having both an end target and a cylindrical target to increase the deposition rate and improve uniformity. However, it is believed that the ionization rate of the sputtered material may not be sufficiently high for many applications.

BRIEF SUMMARY OF THE INVENTION

It is an object of the present invention to provide an improved method and apparatus for generating a plasma within a chamber and for sputter depositing a layer which obviate, for practical purposes, the above-mentioned limitations.

These and other objects and advantages are achieved by a plasma generating apparatus having a first target in which, in accordance with one aspect of the invention, a second independent target is positioned between the first target and an RF coil which inductively couples RF energy into a plasma, so that both targets sputter material onto a workpiece to improve the uniformity of the deposition of sputtered material onto the workpiece. In addition, because the second target is positioned above the coil, the ionization rate of the sputtered material from the second target is increased which can reduce the formation of unwanted voids in the deposition layer deposited into vias, channels and other openings.

In one illustrated embodiment, the second target has a ring-like structure disposed about the circumference of the plasma generation area. The second target is positioned below a generally planar first target but above the coil that inductively couples electromagnetic energy into the plasma in the plasma generation area to increase the density of the plasma. Therefore, material sputtered from both targets will pass through a substantial portion of the high density plasma before reaching the workpiece. Consequently, it is believed that the ionization rate of sputtered material from both targets will be increased.

In another aspect of the present invention, the second target is positioned to shield the outer edge periphery of the first target, as explained in greater detail below, so that sputtering of material from the outer edge periphery of the first target is substantially reduced. Such an arrangement is believed to increase deposition uniformity also.

In another illustrated embodiment, the second target is modified to function as a second antenna coil which, like the first coil, inductively couples electromagnetic energy into the plasma. One end of the second target-coil is coupled to a RF generator through an amplifier and impedance matching network while the other end is coupled to the system ground through a blocking capacitor. The currents through (or voltages applied to) the first and second coils, may have a predetermined phase difference, preferably between $1/4\pi$ to $1\ 3/4\pi$ Radians. Under appropriate settings, this phase difference in the electromagnetic fields generated by the two antenna coils can launch a helicon wave in the plasma. Such helicon waves can be absorbed more uniformly throughout the plasma, such that a plasma excited using a helicon wave can be excited to higher densities.

BRIEF DESCRIPTION OF THE SEVERAL VIEWS OF THE DRAWING

Embodiments of the invention are described with reference to the accompanying drawings which, for illustrative purposes, are schematic and not drawn to scale.

FIG. 2 is a perspective, partial cross-sectional view of a deposition chamber in accordance with one embodiment of the present invention.

DETAILED DESCRIPTION OF THE INVENTION

Figure 1A:
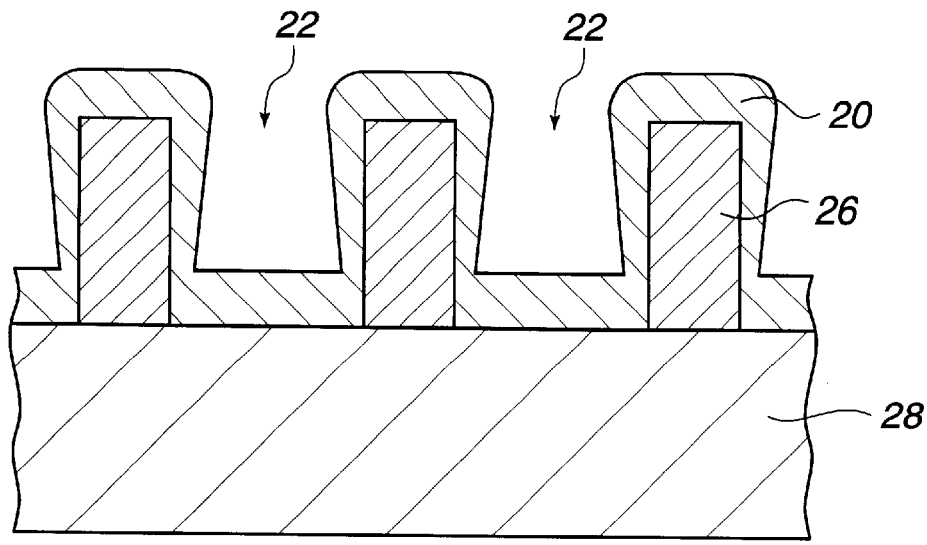
FIGS. 1a and 1b illustrate the formation of voids during a sputter deposition process according to prior art methods.
Figure 1B:
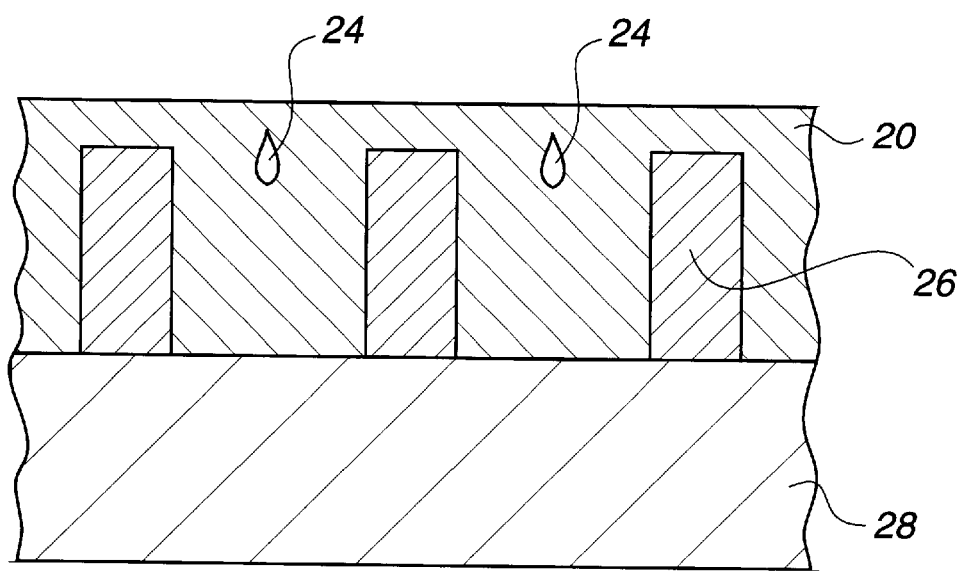
Figure 3:
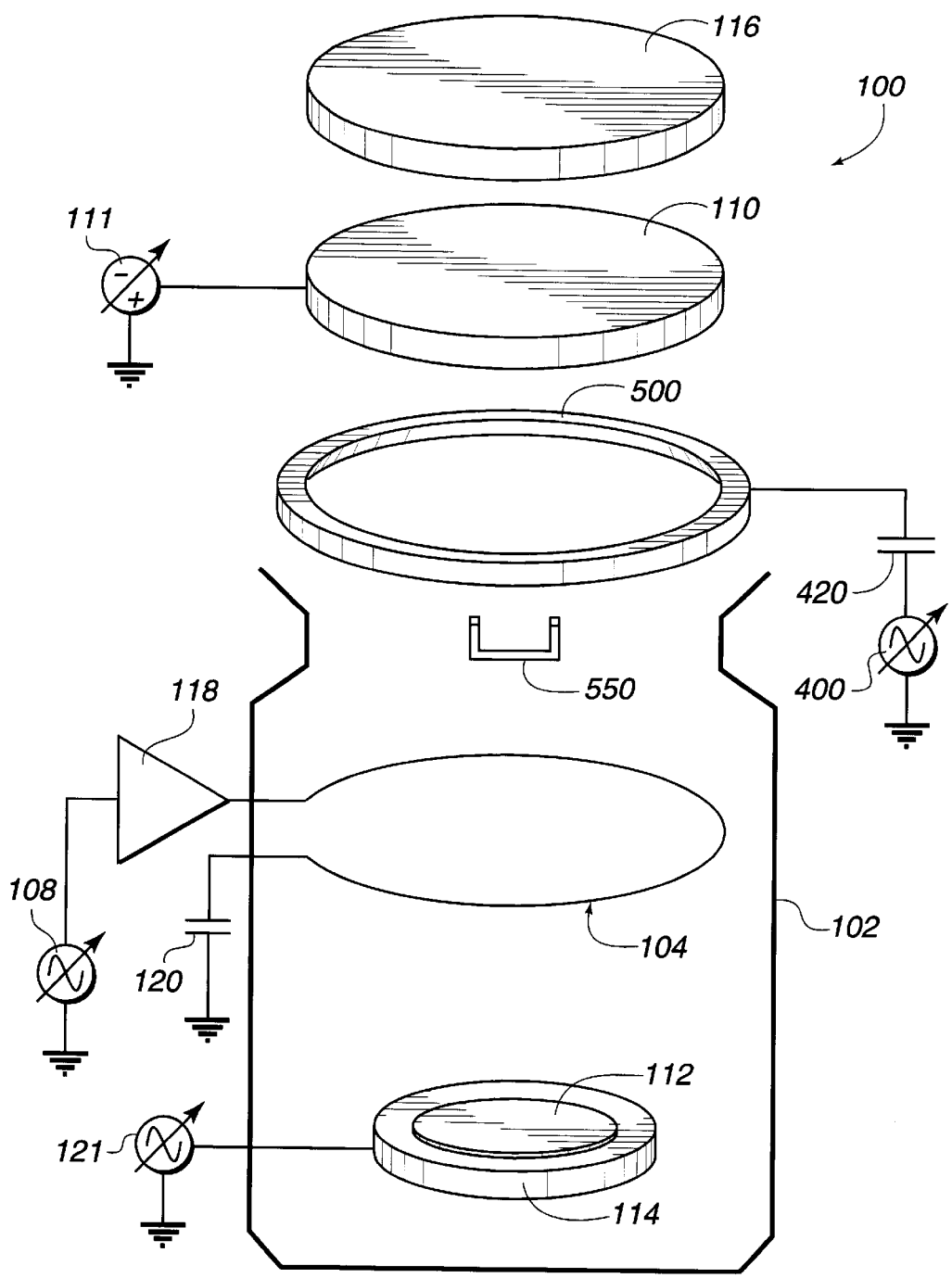
FIG. 3 is a schematic diagram of the electrical interconnections to the chamber of FIG. 2.

Referring first to FIGS. 2 and 3, a deposition in accordance with a first embodiment of the present invention comprises a substantially cylindrical plasma chamber 100 (shown schematically in FIG. 3). The plasma chamber 100 of this embodiment may utilize a multi-turn or single turn coil 104 which is carried internally by a shield 106 (FIG. 2). The shield 106 protects the interior walls 102 of the vacuum chamber 100 from the material being deposited within the interior of the chamber.

Radio frequency (RF) energy from an RF generator 108 (FIG. 3) is radiated from the coil 104 into the interior of the chamber 100, which energizes a plasma within the chamber 100. An ion flux strikes a first target 110 positioned at the top of the chamber 102. The first target 110 is preferably negatively biased by a DC power source 111 to attract an ion flux. The plasma ions eject material from the first target 110 onto a substrate 112 which may be a wafer or other workpiece which is supported by a pedestal support 114 at the bottom of the chamber 100. A first magnet assembly 116, preferably a magnetron which includes one or more fixed or rotating magnets 117, is provided above the first target 110 and produces magnetic fields which sweep over the face of the first target 110 to promote a desired erosion pattern (for example, uniform) on the first target 110.

In accordance with one aspect of embodiments of the present invention, a second target 500 is positioned below the first target 110 but above the coil 104 to sputter material onto the substrate 112 to supplement the material which is being sputtered from the first target 110 onto the workpiece. The second target 500, which has a ring-like structure in the illustrated embodiment, is disposed about the circumference of the plasma generation area, as explained in greater detail below.

The second target 500 may be disposed above the coil 104 and may be biased by a DC or RF power source 400 (FIG. 3). An RF power source is preferentially used instead of a DC power source because DC biasing can, in some applications, be too disruptive to the plasma if applied to the second target 500. It is believed that such a disruptive effect on the plasma can be ameliorated by using the RF power source 400 to induce a DC bias on the second target 500. As a consequence, the ionization of material sputtered from the first target 110 may be maintained, while, at the same time, the ionization of material sputtered from the second target 500 may also be effected. As a result, the layer deposited onto the substrate 112 includes ionized material from both the second target 500 and the first target 110, which can substantially improve the uniformity of the resultant layer and minimize the formation of unwanted cavities in the deposition layer.

The RF generator 108 is preferably coupled to the coil 104 through an amplifier and impedance matching network 118. The other end of the coil 104 is coupled to ground, preferably through a blocking capacitor 120 which may be a variable capacitor. The ionized deposition material is attracted to the substrate 112 and forms a layer thereon. The pedestal 114 may be negatively biased by an AC (or DC or RF) source 121 to externally bias the substrate 112. Alternatively, external biasing of the substrate 112 may optionally be eliminated.

Figure 4:
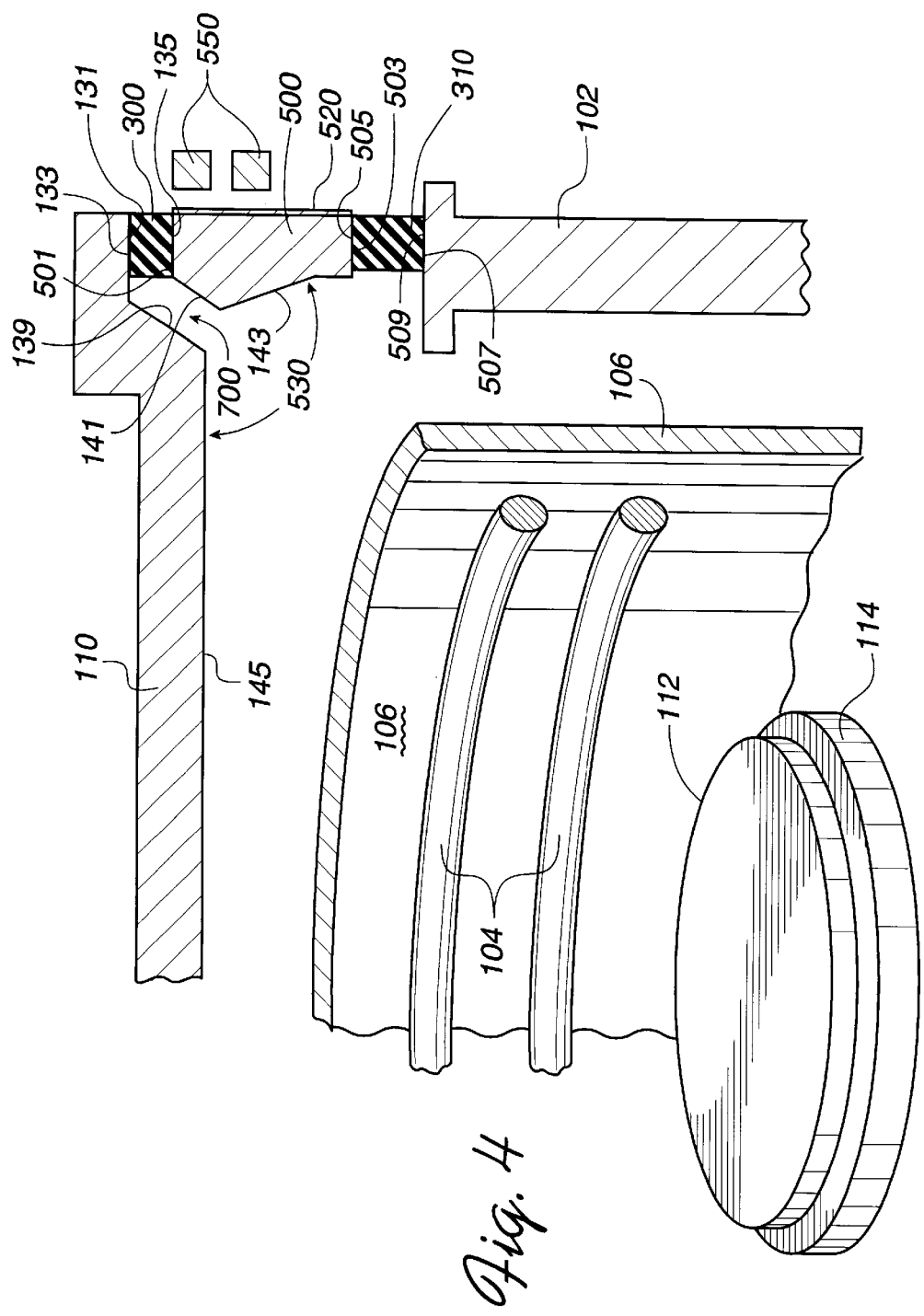
FIG. 4 is a schematic partial cross-sectional view of the chamber of FIG. 2 shown installed in a vacuum chamber.

Referring to the embodiment illustrated in FIG. 4, the first target 110, which is generally disk-shaped, is supported by a first insulative ring assembly 300 which engages the first target 110. A side 131 of the first target 110 is sealably stacked on top of a surface 133 of the first insulative ring assembly 300. An O-ring seal (not shown) may be provided between the side 131 and the surface 133 to provide a vacuum tight assembly from the vacuum chamber. The first insulative ring assembly 300 is in turn supported by the second target 500. A surface 135 of the first insulative ring assembly 300 is sealably stacked on top of a surface 501 of the second target 500. An O-ring sealing surface may also be also provided between the surface 135 and the surface 501. The first target 110 is negatively biased and is preferably insulated from the second target 500 which is biased by a different source, for example, the RF power source 400. Therefore, the first insulative ring assembly 300 which may be made of a variety of insulative materials including ceramic spaces the first target 110 from the second target 500 to facilitate separately biasing the two targets.

The second target 500 is supported by a second insulative ring assembly 310 which engages both the second target 500 and the vacuum chamber wall 102. Thus the second target 500 may act as an extension of the vacuum chamber wall 102. A surface 503 of the second target 500 is sealably stacked on top of a surface 505 of the second insulative ring assembly 310, and a surface 507 of the second insulative ring assembly 310 is also sealably stacked on top of a surface 509 of the vacuum chamber wall 102. O-ring seals may be provided between the surfaces 503 and 505, and between the surfaces 507 and 509. The second insulative ring 310 is supported by the vacuum chamber wall 102 which is preferably at ground. The second insulative ring 310, which also may be made of a variety of insulative materials including ceramics, spaces the second target 500 from the chamber 100 so that the second target may be appropriately biased by the RF power source 400. A backing plate 520 may be attached to the outer surface of the second target 500.

As seen in FIG. 4, the second target 500 may be shaped to shield the periphery or the outer edges of the first target 110, and provide a narrow strip of space between the outer edge surface 139 of the first target 110 and an upper edge surface 141 of the second target 500. By shielding the outer edge surfaces of the first target 110, a dark space 700, which has a reduced or preferably zero plasma density, may be formed in the narrow strip of space between the first target surface 139 and the second target surface 141 such that sputtering of material from the first target outer edges may be reduced.

As illustrated in FIG. 4, a sputtering face surface 143 of the second target 500 may be slanted downwardly away from the center of the chamber 100, thereby forming an angle 530 greater than ninety degrees with respect to the bottom sputtering surface 145 of the first target 110. The formation of an angle greater than ninety degrees between the side 145 and the side 143 can reduce sputtering of material from the first target 110 onto the second target 500 because much of the sputtered material travels parallel to the vertical axis of the chamber 100 or at relatively small oblique angles relative to the vertical axis. If the angle were less than ninety degrees, more sputtered material from the first target 110 could contact the second target 500 and deposit on the second target 500 while traveling parallel to the vertical axis of the plasma chamber 100 towards the workpiece. Material sputtered from the second target 500 onto the first target 110 is also minimized by having an angle greater than ninety degrees. However, the above arrangement may not completely prevent the targets from depositing material on each other since some of the sputtered material travels at an oblique angle with respect to the vertical axis of the plasma chamber 100.

Although the second target 500 is illustrated as having a generally convex exposed sputtering face comprising the surfaces 141 and 143, it should be appreciated that the second target 500 may have an exposed sputtering face having other shaped surfaces including flat and concave surfaces.

Certain embodiments may utilize a second magnet assembly, preferably a rotating magnet assembly 550 adjacent to the second target 500, which rotates around the second target 500 and produces magnetic fields that sweep across the face of the second target 500 to promote uniform erosion of the second target 500. The second rotating magnet assembly 550 may have an annular form and include a plurality of pole pairs. In the illustrated embodiment, the poles of each pair are spaced from one another in the vertical direction, i.e., parallel to the center axis of chamber 100. The pole pairs are spaced from adjacent pole pairs circumferentially around the magnet assembly 550. Magnet assembly 550 can be mounted and operated to rotate continuously in a single direction about the vertical center axis of chamber 100. Magnet assembly 550 can also be mounted and oper- ated to oscillate back and forth with an amplitude that allows the path of travel of one magnet pole pair to overlap that of each adjacent pole pair. The magnetic field created by the second rotating magnet assembly 550 traps electrons, within the vicinity of the second target 500, that ionize the chamber gas to produce ions which in turn impact the surface of the second target 500 to sputter material from the second target.

Figure 5:
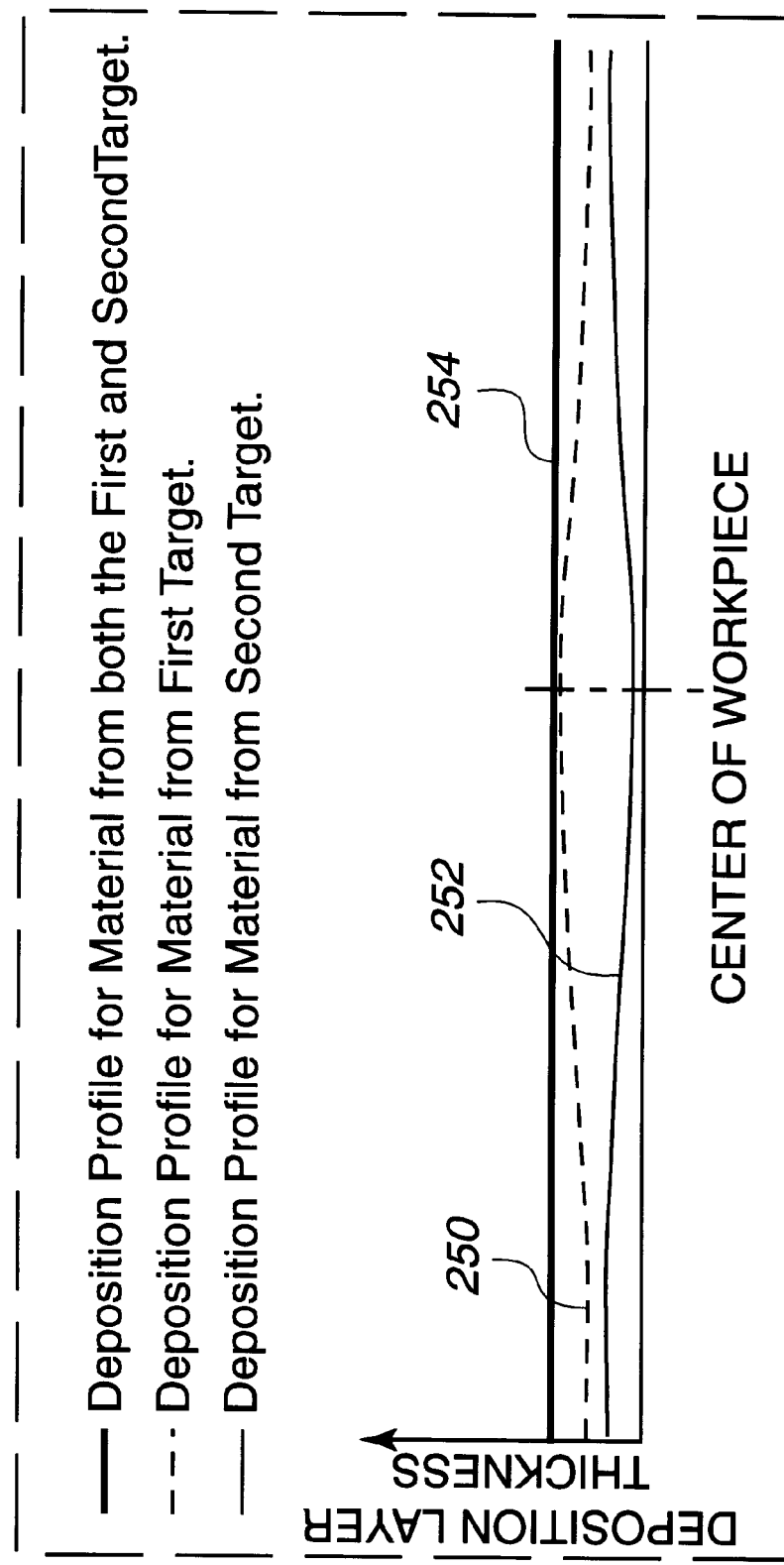
FIG. 5 is a chart depicting the respective deposition profiles for material deposited from the first and second targets of the chamber of FIG. 1.

As previously mentioned, in order to accommodate the coil 104 to facilitate ionization of the plasma, it has been found beneficial to space the target 110 from the surface of the workpiece 112. However, this increased spacing between the target and the workpiece can adversely impact the uniformity of the material being deposited from the target. As indicated at 250 in FIG. 5, such nonuniformity typically exhibits itself as a thickening of the deposited material toward the center of the workpiece with a consequent thinning of the deposited material toward the edges of the workpiece.

In accordance with one feature of embodiments of the present invention, this nonuniformity can be compensated by sputtering deposition material not only from the first sputter target 110 above the workpiece but also from the second target 500 disposed about the circumference of the plasma generation area and below the first target 110. Because the edges of the workpiece 112 are closer to the second target 500 than the center of the workpiece 112, it is believed that a greater proportion of the material sputtered from the second target 500 may be deposited near the edges of the workpiece 112 than at the center, as indicated at 252 in FIG. 5. This is the reverse of the deposition pattern of sputtered material from the first target 110. By appropriately adjusting the ratio of the RF power level of the bias applied to the second target 500 to the DC power level of the bias applied to the first target 110, it is believed that the deposition level of the material being sputtered from the second target 500 can be selected in such a manner as to compensate for nonuniformity of the deposition profile of the material from the first target 110 such that the overall deposition profile of the layer from both sources of sputtered material as indicated by the deposition profile 254 in FIG. 5 can be substantially more uniform than that which has often been obtained from the first target 110 alone.

As set forth in copending application Ser. No. 08/680,335, filed Jul. 10, 1996 (Attorney Docket No. 1390-CIP/PVD/ DV) entitled "Coils For Generating A Plasma And For Sputtering" by Jaim Nulman, Sergio Edelstein, Mani Subramani, Zheng Xu, Howard Grunes, Avi Tepman, John Forster, assigned to the assignee of the present application, the coil for inductively coupling RF energy into the plasma may be adapted to become yet another target to sputter material onto the workpiece. In the aforementioned copending application Ser. No. 08/680,335, the ratio of the RF power applied to the coil in comparison to the DC power applied to the target affected the ratio of amount of material sputtered from the coil in comparison to the target. Similarly, it is presently believed that the amount of sputtering which originates from second target 500 as compared to the sputtering which originates from the first target 110 is also a function of the RF power applied to the second target 500 relative to the DC power applied to the first target 110.

By adjusting the ratio of the RF power to the DC power applied, the relative amounts of material sputtered from the first target 110 and the second target 500 may be varied so as to achieve improved uniformity. Thus, a particular ratio of the second target RF power to the first target DC power may achieve a smaller degree of non-uniformity of the layer of material deposited from both the coil and the target. It is believed that as the RF power to the second target 500 is increased relative to the DC power applied to the first target 110, the deposited layer tends to be more edge thick. Conversely, it is also believed that by decreasing the ratio of the RF power to the second target 500 relative to the DC power applied to the first target 110, the center of the deposited layer tends to grow increasingly thick relative to the edges as represented by the increasingly positive percentage of non-uniformity. Thus, by adjusting the ratio of the RF power to the second target 500 relative to the DC power biasing the first target 110, the material being sputtered from the second target 500 can be increased or decreased as appropriate to compensate for non-uniformity of the material being deposited from the first target 110 to achieve a more uniform deposited layer comprising material from both the target and the coil.

Although the second target 500 is illustrated as having a continuous generally ring-shape, it should be appreciated that the second target 500 may comprise other shapes including separate, spaced segments.

Figure 6:
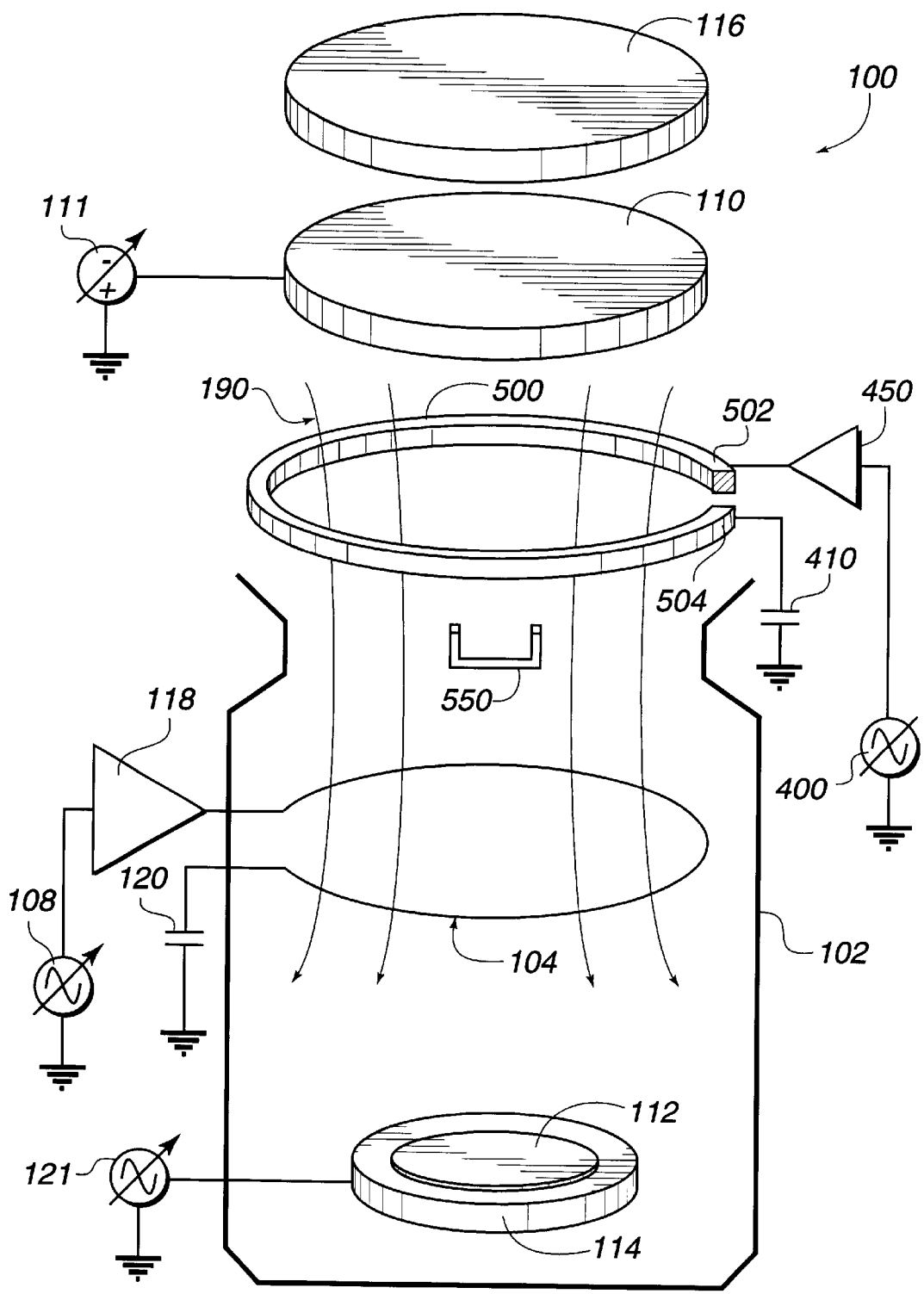
FIG. 6 is a schematic diagram of the electrical interconnections to a deposition chamber in accordance with another embodiment of the present invention.

In another embodiment as illustrated in FIG. 6, the second target 500 functions as a second antenna coil which inductively couples electromagnetic energy into the plasma. A vertical slit is provided through the annular-shaped second target 500 to form two separate ends 502 and 504. One end 502 of the second target is coupled to the RF generator 400 through a second amplifier and impedance matching network 450 while the other end 504 is coupled to the system ground through a blocking capacitor 410.

The coil 104 functions as a first antenna coil for inductively coupling electromagnetic energy into the plasma. The second target 500 likewise functions as a second antenna coil to inductively couple electromagnetic energy into the plasma.

Imposed upon the plasma is a substantially uniform, axially oriented magnetic field (as represented by magnetic line of force 190). The magnetic field may be generated by, for example, Helmholtz coils coaxial with the chamber axis. The RF energy radiated by the coil 104 into the interior of the plasma chamber 100 is preferably phase shifted by a predetermined amount from the RF energy radiated by the second target 500 such that a helicon wave is launched and maintained in the plasma chamber 100. The phase of the RF energy can be shifted by using a phase shift regulating network, preferably to effect a phase shift between ¼π to 1 ¾π Radians.

Because of the helicon wave, the energy distribution of the plasma may be more uniform and the density of the plasma may be increased. A plasma excited using a helicon wave can be excited to densities in the range of $10^{11}$ to $10^{13}$ electrons $cm^{-3}$. The higher plasma density is beneficial to ionize a higher proportion of material sputtered from the targets. As a result, the sputtered material can be more responsive to electric fields adjacent to the wafer 112, which enhances the perpendicularity of the metal flux to the wafer 112. Consequently, fine features may be coated more uniformly, and high aspect ratio holes and trenches may be filled with little or no void formation. Such electric fields may be induced by electrically biasing the wafer and/or pedestal negatively with respect to the plasma with an RF supply 121 (FIG. 3) to impose an HF RF signal (e.g., 13.6 MHz) to the pedestal through a matching network. The above arrangement also allows for operation of the plasma chamber 100 at a pressure below 10 mT.

In another embodiment, the coil 104 can also be adapted to sputter material from the coil 104 onto the workpiece to supplement the material being sputtered from the targets 101 and 500 onto the workpiece as set forth in greater detail in the aforementioned copending application Ser. No. 08/680, 335. The coil 104 can be made of the same type of material as the targets 110 and 500 or the coil 104 can be made from a different type of material. For example, the coil 104 and the targets 110 and 500 can be made of titanium or aluminum. If it is desired to deposit a mixture or combination of materials, the first and second targets and the coil 104 can be formed from the same mixture of materials or alternatively from different materials such that the materials combine or mix when deposited on the substrate. In addition, the RF power applied to the coil 104 can be set independently of the biases applied to the targets 110 and 500 for optimization of the plasma density for ionization.

The coil 104 may be carried on the shield 106 by a plurality of coil standoffs which electrically insulate the coil 104 from the supporting shield 106. The insulating coil standoffs have an internal labyrinth structure which permits repeated deposition of conductive materials from the target 110 onto the coil standoffs while preventing the formation of a complete conducting path of deposited material from the coil 104 to the shield 106 which could short the coil 104 to the shield 106 (which is typically at ground).

RF power may be applied to the coil 104 by feedthroughs which are supported by insulating feedthrough standoffs. The feedthrough standoffs, like the coil support standoffs, permit repeated deposition of conductive material from the target onto the feedthrough standoff without the formation of a conducting path which could short the coil 104 to the shield 106. Thus, the coil feedthrough standoff has an internal labyrinth structure somewhat similar to that of the coil standoff to prevent the formation of a short between the coil 104 and the wall 140 of the shield.

The chamber shield 106 may be generally bowl-shaped and include a generally cylindrically shaped, vertically oriented wall 140 to which the standoffs are attached to insulatively support the coil 104. The shield may further have a generally annular-shaped floor wall 142 which surrounds the chuck or pedestal 114 which supports the workpiece 112 which has an 8" diameter in the illustrated embodiment. A clamp ring may be used to clamp the wafer to the chuck 114 and cover the gap between the floor wall of the shield 106 and the chuck 114. The chamber shield 106 is grounded to the system ground.

The appropriate RF generators and matching circuits are components well known to those skilled in the art. For example, an RF generator such as the ENI Genesis series which has the capability to "frequency hunt" for the best frequency match with the matching circuit and antenna is suitable. The frequency of the generator for generating the RF power to the coil 104 is preferably 2 MHz but it is anticipated that the range can vary from, for example, 1 MHz to 100 MHz. An RF power setting of 4.5 kW is preferred but a range of 1.5–5 kW is believed to be satisfactory. In some applications, energy may also be transferred to the plasma by applying AC or DC power to coils and other energy transfer members. A DC power setting for biasing the target 110 of 3 kW is preferred but a range of 2–5 kW and a pedestal bias voltage of –30 volts DC is believed to be satisfactory for many applications.

A variety of precursor gases may be utilized to generate the plasma including, for example, $Ar_1$ $H_2$, or reactive gases such as $NF_3$ and $CF_4$. Various precursor gas pressures are suitable including, for example, pressures of 0.1–50 mTorr. For ionized PVD, an Ar gas or an $Ar/N_2$ gas mixture pressure between 10 and 100 mTorr is preferred for best ionization of sputtered material.

It will, of course, be understood that modifications of the present invention, in its various aspects, will be apparent to those skilled in the art, some being apparent only after study others being matters of routine mechanical and electronic design. Other embodiments are also possible, their specific designs depending upon the particular application. As such, the scope of the invention should not be limited by the particular embodiments herein described but should be defined only by the appended claims and equivalents thereof.

What is claimed is:

1. An apparatus for sputtering material onto a workpiece supported by a support in a chamber, comprising:
   a plasma generation area in said chamber;
   a first target positioned in said chamber to sputter a first target material through said plasma generation area to a workpiece, wherein said first target has an outer edge periphery;
   a second target electrically insulated from said first target and positioned in said chamber adjacent to but spaced from said first target outer periphery to shield said outer edge periphery of said first target from plasma in said plasma generation area, and to sputter a second target material through said plasma generation area to said workpiece; and
   a coil positioned between said first target and said workpiece support and also positioned between said second target and said workpiece support, to inductively couple energy into said plasma generation area to generate and sustain a plasma in said plasma generation area.

2. The apparatus of claim 1, wherein said second target has a ring shape and is disposed about an outer circumference of said plasma generation area.

3. The apparatus of claim 2, wherein said first target is generally disk-shaped and second target is disposed about an outer circumference of said first target.

4. The apparatus of claim 1, wherein at least a portion of said second target is disposed closer to said coil than said first target.

5. The apparatus of claim 1 wherein said chamber has a wall, said apparatus further comprising:
   a first insulative ring assembly disposed between said first target and said second target; and
   a second insulative ring assembly disposed between said second target and said wall of said chamber.

6. The apparatus of claim 5, wherein said first target is carried by said first insulative ring assembly.

7. The apparatus of claim 6, wherein said first insulative ring assembly is carried by said second target such that said first insulative ring assembly electrically isolates said first target from said second target.

8. The apparatus of claim 7, wherein said second target is carried by said second insulative ring assembly, and said second insulative ring assembly is carried by said wall of said chamber such that said second insulative ring assembly electrically isolates said second target from said wall.

9. The apparatus of claim 1, wherein said chamber comprises a pressure vessel and said first and second targets each comprise a portion of said pressure vessel.

10. The apparatus of claim 1, wherein said first and second target materials are deposited on said workpiece, said first target material deposited in a first non-uniform deposition profile, said second target material deposited in a second non-uniform deposition profile, wherein the combination of said first and second non-uniform deposition profiles results in an overall deposition profile that is more uniform than either of the first and second non-uniform deposition profiles.

11. The apparatus of claim 1, wherein said first target has an outer edge periphery and second target is positioned to shield said outer edge periphery of said first target from said plasma, and wherein said second target is spaced from said outer edge periphery of said first target to form a dark space between said first and second targets.

12. The apparatus of claim 1, wherein said first target has a sputtering face oriented toward said workpiece support and wherein said second target has a sputtering face oriented toward said plasma area, said first target sputtering face forming an angle of greater than 90 degrees with respect to said second target sputtering face.

13. The apparatus of claim 1 further comprising:
   a first source for applying a DC bias to said first target;
   a second source for applying a RF bias to said second target;
   a generator for applying RF power to said coil;
   wherein said DC bias of said first target and said RF bias of said second target have a predetermined relationship so that the deposition of said second target material deposited on said workpiece compensates for nonuniformity in the deposition of said first target material deposited on said workpiece.

14. The apparatus of claim 1 further comprising magnet means for rotating magnetic fields adjacent said second target to distribute erosion of said second target.

15. The apparatus of claim 1, wherein said coil is formed of sputterable material and acts as a third target so that material from said coil and from said first and second targets is deposited on said workpiece.

16. An apparatus for sputtering material onto a workpiece supported by a support in a chamber, comprising:
   a plasma generation area in said chamber;
   a first target means disposed in said chamber for sputtering a first target material through said plasma generation area to a workpiece, wherein said first target has an outer edge periphery;
   a second target means electrically insulated from said first target means and disposed in said chamber adjacent to but spaced from said first target outer periphery, for shielding said outer edge periphery of said first target means from plasma in said plasma generation area, and for sputtering a second target material through said plasma generation area to a workpiece; and
   a coil means disposed between said first target means and said workpiece support and also disposed between said second target means and said workpiece support, for inductively coupling energy into said plasma generation area to generate and sustain a plasma in said plasma generation area.

17. An apparatus for sputtering material onto a workpiece, the apparatus comprising:
   a chamber having a plasma generation area within said chamber and a pressure vessel comprising a wall;
   a first target disposed in said chamber and having a generally disk-shaped sputtering surface for sputtering a first target material onto said workpiece;
   a second ring shaped-target disposed around but spaced from said first target in said chamber for sputtering a second target material onto said workpiece;

a first insulative ring assembly disposed between said first target and said second target wherein said first target is carried by said first insulative ring assembly and said first insulative ring assembly is carried by said second target such that said first insulative ring assembly electrically isolates said first target from said second target;

a second insulative ring assembly disposed between said second target and said wall of said chamber wherein said second target is carried by said second insulative ring assembly, and said second insulative ring assembly is carried by said wall of said chamber such that said second insulative ring assembly electrically isolates said second target from said wall; and a coil positioned between said second target and said workpiece, for coupling RF energy into said plasma generation area to ionize both said first and second target materials.

18. An apparatus for sputtering material onto a workpiece, the apparatus comprising:

a chamber including a plasma generation area;

a first target disposed in said chamber and having an outer edge;

a coil adapted to couple a first RF energy into said plasma generation area; and a second target disposed between said coil and said first target in said chamber and adapted to couple a second RF energy into said plasma generation area wherein said second target is electrically insulated from said first target and is positioned to shield said outer edge periphery of said first target from said plasma, and wherein said second target is spaced from said outer edge periphery of said first target to form a dark space between said first and second targets.

19. The apparatus of claim 18, wherein said second target has a ring shape and is disposed about an outer circumference of said plasma generation area.

20. An apparatus as in claim 18, wherein at least a portion of said second target is disposed closer to said coil than said first target.

21. The apparatus of claim 18, further comprising:

a vacuum chamber having a wall;

a first insulative ring assembly disposed between said first target and said second target; and a second insulative ring assembly disposed between said second target and said wall.

22. The apparatus of claim 21, wherein said first target is carried by said first insulative ring assembly and said first insulative ring assembly is carried by said second target such that said first insulative ring assembly electrically isolates said first target from said second target.

23. The apparatus of claim 22, wherein said second target is carried by said second insulative ring assembly, and said second insulative ring assembly is carried by said wall of said vacuum chamber such that said second insulative ring assembly electrically isolates said second target from said wall.

24. The apparatus of claim 18 wherein said second target is coil-shaped.

25. The apparatus of claim 24, wherein a slit is formed in said second target and extends across said second target so that said second target has two ends which define said slit.

26. The apparatus of claim 25 further comprising an amplifier and impedance matching network and an RF source coupled through said amplifier and impedance matching network to one of said second target ends.

27. The apparatus of claim 26 further comprising a blocking capacitor coupled to the other of said second target ends.

28. The apparatus of claim 18, further comprising means for establishing an axial magnetic field within said chamber.

29. The apparatus of claim 22 further comprising means for establishing a predetermined phase difference between said first RF energy and said second RF energy so that a helicon wave is launched in said plasma.

30. The apparatus of claim 29, wherein said helicon wave creates a plasma density between $10^{11}$ and $10^{13}$ electrons/cc within said plasma generation area.

31. The apparatus of claim 18 further comprising at least one magnet positioned in close proximity to said second target.

32. The apparatus of claim 31 further comprising means for moving said magnet relative to said second target.

33. The apparatus of claim 31 further comprising at least a second magnet positioned in close proximity to said second target, said first and second magnets being positioned to form a first pole pair of magnets having ends of opposite polarity oriented toward said second target.

34. The apparatus of claim 33, further comprising a second pole pair of magnets and means for moving said first and second pole pairs in oscillatory motions defining overlapping paths.

35. The apparatus of claim 18, further comprising a magnetron positioned adjacent said first target and a power source to bias said first target negatively with respect to ground.

36. A method for sputtering a layer onto a workpiece on a support in a chamber comprising:

sputtering a first target material from a first target;

sputtering a second target material from a second target electrically insulated from said first target;

shielding an outer edge periphery of said first target from a plasma using said second target;

maintaining a plasma using RF energy from an RF coil positioned between said first target and said workpiece support and positioned between said second target and said workpiece support;

ionizing at least a portion of said first and second sputtered materials using said plasma; and forming a layer of the first and second sputtered target materials on said workpiece.

37. A method as in claim 36, further comprising the steps of:

applying a DC bias to said first target; and applying an RF bias to said second target.

38. A method as in claim 37, further comprising the steps of:

controlling said DC bias and said RF bias so that said layer formed on said workpiece has a substantially uniform thickness.

39. A method as in claim 36, further comprising:

depositing said first target material on said workpiece in a first non-uniform deposition profile;

depositing said second target material on said workpiece in a second non-uniform deposition profile; and controlling the deposition of said first and second target materials so that said layer formed from the deposition of said first and second target materials on said workpiece has a overall deposition profile that is more uniform than either of the first and second non-uniform deposition profiles.

40. A method for ionizing sputtered material comprising:

sputtering a first target material from a first target disposed in a chamber and having a generally disk-shaped sputtering surface and an outer edge periphery surrounding said sputtering surface;

sputtering a second target material from a second ring-shaped target electrically insulated from said first target and disposed around but spaced from said first target in said chamber so as to shield said outer edge Periphery of said first target from a plasma and to form a dark space between said first and second targets;

maintaining a plasma using RF energy from an RF coil positioned between said first target and a workpiece support and positioned between said second target and said workpiece support;

ionizing said at least a portion of said first and second sputtered materials using said plasma; and forming a layer of the first and second sputtered target materials on a workpiece on said support.

* * * * *